United States Patent
Ono et al.

(10) Patent No.: US 7,309,449 B2
(45) Date of Patent: Dec. 18, 2007

(54) SUBSTRATE PROCESSING METHOD

(75) Inventors: Haruko Ono, Tokyo (JP); Sachiko Takeda, Tokyo (JP); Ichiro Katakabe, Tokyo (JP)

(73) Assignee: Ebara Corporation, Tokyo (JP)

( * ) Notice: Subject to any disclaimer, the term of this patent is extended or adjusted under 35 U.S.C. 154(b) by 61 days.

(21) Appl. No.: 10/755,314

(22) Filed: Jan. 13, 2004

(65) Prior Publication Data

US 2004/0226915 A1 Nov. 18, 2004

(30) Foreign Application Priority Data

Jan. 14, 2003 (JP) ............................. 2003-006016

(51) Int. Cl.
*B44C 1/22* (2006.01)

(52) U.S. Cl. .................... 216/83; 216/88; 216/89; 216/95; 216/96; 216/105; 252/79.1; 252/79.3; 451/41

(58) Field of Classification Search ................ 216/83, 216/88, 89, 95, 96, 105; 252/79.1, 79.3; 451/41
See application file for complete search history.

(56) References Cited

U.S. PATENT DOCUMENTS

| | | | | |
|---|---|---|---|---|
| 3,992,235 A | * | 11/1976 | Garbarini | .................... 438/754 |
| 5,620,558 A | * | 4/1997 | Hanson et al. | ................. 216/95 |
| 5,770,095 A | * | 6/1998 | Sasaki et al. | ................. 216/38 |
| 5,981,454 A | * | 11/1999 | Small | .......................... 510/175 |
| 6,040,243 A | * | 3/2000 | Li et al. | ...................... 438/687 |
| 6,238,592 B1 | * | 5/2001 | Hardy et al. | ................ 252/79.1 |
| 6,326,299 B1 | * | 12/2001 | Homma et al. | ............. 438/633 |
| 6,426,020 B1 | * | 7/2002 | Okada et al. | ............... 252/79.1 |
| 6,475,909 B2 | * | 11/2002 | Uozumi | ...................... 438/678 |
| 6,663,469 B2 | | 12/2003 | Kimura et al. | |
| 2002/0017064 A1 | * | 2/2002 | Shimazu et al. | .............. 51/309 |
| 2003/0073310 A1 | * | 4/2003 | Olgado et al. | .............. 438/689 |

FOREIGN PATENT DOCUMENTS

WO          01/06555          1/2001

* cited by examiner

*Primary Examiner*—Shamim Ahmed
(74) *Attorney, Agent, or Firm*—Wenderoth, Lind & Ponack, L.L.P.

(57) ABSTRACT

A substrate processing enables etching of a barrier metal film at around room temperature without application of a mechanical load and without excessive etching of a necessary portion of copper. The substrate processing flattens a copper film and a barrier metal film, both exposed on a surface of a substrate, by using an etching liquid capable of adjusting the etching rate ratio between the copper film and the barrier metal film.

16 Claims, 1 Drawing Sheet

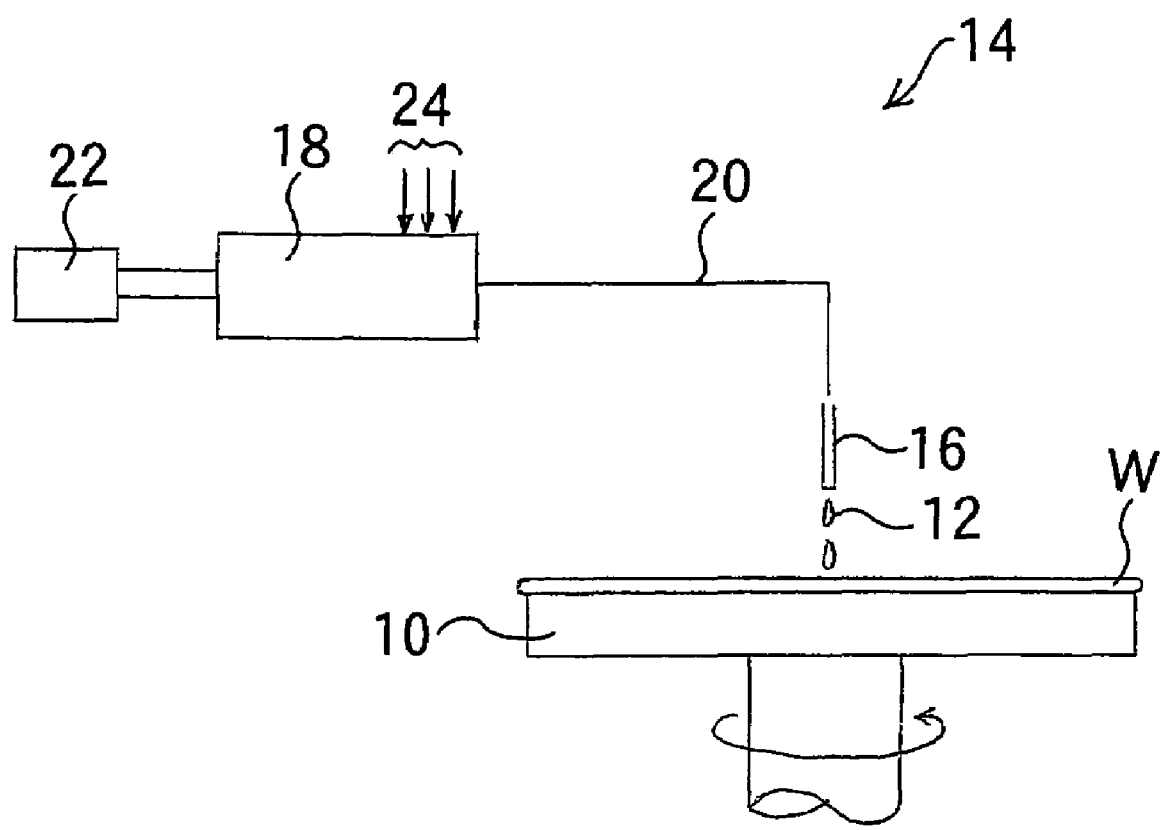

SUBSTRATE PROCESSING METHOD

BACKGROUND OF THE INVENTION

1. Field of the Invention

The present invention relates to etching of an exposed copper film and an exposed barrier metal film in the production of a semiconductor substrate, and more specifically to a substrate processing method which, by adjusting the etching rate ratio between a copper film, which is to form interconnects on a substrate, and a barrier metal film, can etch the barrier metal film selectively and provide a flattened finish surface.

2. Description of the Related Art

As a technique for forming circuit interconnects on e.g. a silicon substrate, a so-called damascene process, which comprises forming fine interconnect trenches and via holes in a substrate and then embedding copper or a copper alloy in the trenches and via holes to form interconnects, has recently been employed. In the damascene process, chemical mechanical polishing (CMP) is carried out for the formation of interconnects of e.g. copper embedded in the fine trenches and via holes.

Such a damascene process is generally carried out by first forming an inter-level dielectric on a substrate, forming trenches and via holes in the inter-level dielectric, forming a coating film for preventing diffusion of copper, called barrier metal film, on the entire surface, and then depositing an interconnect material, such as copper, on the barrier metal film. Thereafter, CMP is carried out generally in two steps: a first polishing step of primarily polishing the interconnect material, such as copper; and a second polishing step of primarily polishing the barrier metal film. A barrier metal film having a high hardness, such as a Ta film, has recently been employed. For such a barrier metal film, the second step of polishing is effected mainly by mechanical action, rather than chemical action, and a pressure load of several hundred g/cm$^2$ is generally necessary.

The strength of the inter-level dielectric on the substrate varies depending upon the film material. Some inter-level dielectrics cannot endure the pressure load upon the second-step polishing of barrier metal film though they endure the pressure load upon the first-step polishing of copper. In particular, development of inter-level dielectrics having a low dielectric constant, such as a film of a low-k material, is advancing in order to enhance the performance of semiconductor devices through a reduction of the volume of copper damascene interconnects. Such inter-level dielectrics, as compared to common inter-level dielectrics currently used, are especially poor in mechanical strength. Accordingly, even when a cap layer as a protective film is formed on an inter-level dielectric of e.g. a low-k material, peel-off of a layer over the cap layer can occur upon CMP. This makes the application of CMP difficult.

Further, in the generation of ultra low-k materials, only a pressure load of no more than several ten g/cm$^2$ can be applied to an inter-level dielectric. Thus, the use of such an inter-level dielectric makes CMP impracticable for the first-step polishing and the second-step polishing. In view of the above, electrolytic polishing, chemical etching, and the like, may be considered for use in etching of a copper film and a barrier metal film on a substrate.

Electrolytic polishing, however, has the problem that though a copper film can be polished electrolytically, a passive oxide film is formed on the surface of a barrier metal film, e.g. Ta or TaN film, during electrolytic polishing, which retards or stops the progress of electrolytic processing.

Chemical etching of a barrier metal film at a practical rate necessitates the use of an acid or oxidizing agent at a high concentration and at a temperature higher than room temperature. Such a chemical etching liquid, however, can cause considerable damage to copper. Even a necessary portion of copper can inevitably be etched if an anticorrosive agent is used.

SUMMARY OF THE INVENTION

The present invention has been made to solve the above problems. It is therefore an object of the present invention to provide a process that enables etching of a barrier metal film at around room temperature without application of a mechanical load and without excessive etching of a necessary portion of copper.

The present inventors have made an intensive study of a chemical etching liquid which can achieve a practical etching rate for a barrier metal film while suppressing the etching rate of a copper film and, as a result, have found the following:

① Copper can be etched easily with a mixture of an acid and an oxidizing agent. If the mixing ratio between acid and oxidizing agent is extremely disproportionate, however, the etching rate of copper decreases even with an acid or an oxidizing agent at a high concentration ② In etching of copper with a mixture of an acid other than hydrochloric acid and an oxidizing agent, the etching rate of copper is known to decrease either by mixing of a small amount of chloride ions into the mixture or by addition of an anticorrosive agent to the mixture. However, it has now been found that an excessive amount of chloride ions can incur a rise in the etching rate.

③ The addition of both chloride ions and an anticorrosive agent to a mixture of an acid and an oxidizing agent can further decrease the etching rate of copper. However, when the anticorrosive agent is present in excess in the system in which the chloride ions and the anticorrosive agent are co-present, the effect of decreasing the etching rate is lower.

④ When a compound, which serves as a source of copper ions, is added to a liquid capable of etching a barrier metal film, the etching rate of the barrier metal film increases.

With these findings considered comprehensively, it has been found that it is possible to bring the etching rate of a copper film and the etching rate of a barrier metal film close to each other, and obtain a processing method suited for processing of a semiconductor substrate, which has led to accomplishment of the present invention.

The present invention provides a substrate processing method comprising: flattening a copper film and a barrier metal film, both exposed on a surface of a substrate, by using an etching liquid capable of adjusting the etching rate ratio between the copper film and the barrier metal film.

The etching liquid preferably contains hydrofluoric acid, an oxidizing agent and a chloride.

The etching liquid may be supplied to the surface of the substrate from a chemical supply apparatus which can arbitrarily set the mixing ratio of the liquid components. The components of the etching liquid to be supplied from the chemical supply apparatus may be controlled variably during continuous supply of the etching liquid to the surface of the substrate.

The chloride is, for example, copper chloride and its content may be 1 to 1000 mg/L. The oxidizing agent is, for example, hydrogen peroxide and its content may be not more than $\frac{1}{10}$ of the weight of hydrofluoric acid. The barrier metal film is composed of, for example, tantalum and/or a tantalum compound, titanium and/or a titanium compound, or tungsten and/or a tungsten compound.

In a preferred embodiment of the present invention, the barrier metal film is composed of tantalum nitride and/or tantalum, or titanium nitride and/or titanium, the etching liquid contains hydrofluoric acid, an oxidizing agent and a chloride, and the ratio ($R_{BM}/R_{CU}$) of the etching rate ($R_{BM}$) of the barrier metal film to the etching rate ($R_{CU}$) of the copper film is 1 to 100.

In a preferred embodiment of the present invention, the barrier metal film is composed of tantalum nitride and/or tantalum, or titanium nitride and/or titanium, the etching liquid contains hydrofluoric acid, an oxidizing agent, a chloride and an organic acid, and the ratio ($R_{BM}/R_{CU}$) of the etching rate ($R_{BM}$) of the barrier metal film to the etching rate ($R_{CU}$) of the copper film is 1 to 100.

In a preferred embodiment of the present invention, the barrier metal film is composed of tantalum nitride and/or tantalum, or titanium nitride and/or titanium, the etching liquid contains hydrofluoric acid, an oxidizing agent, a copper compound and a chloride and/or an anticorrosive agent for copper, and the ratio ($R_{BM}/R_{CU}$) of the etching rate ($R_{BM}$) of the barrier metal film to the etching rate ($R_{CU}$) of the copper film is 1 to 100.

In a preferred embodiment of the present invention, the barrier metal film is composed of tungsten nitride and/or tungsten, the etching liquid contains an oxidizing agent and has a pH of not less than 3, and the ratio ($R_{BM}/R_{CU}$) of the etching rate ($R_{BM}$) of the barrier metal film to the etching rate ($R_{CU}$) of the copper film is 1 to 100.

The oxidizing agent is, for example, hydrogen peroxide and its content may be 1 to 20% by mass. The pH of the etching liquid may be adjusted by adding e.g. an organic acid thereto.

In a preferred embodiment of the present invention, the barrier metal film is composed of tungsten nitride and/or tungsten, the etching liquid contains an oxidizing agent and a copper compound and has a pH of not less than 3, and the ratio ($R_{BM}/R_{CU}$) of the etching rate ($R_{BM}$) of the barrier metal film to the etching rate ($R_{CU}$) of the copper film is 1 to 100.

The copper compound is, for example, copper chloride and its content may be 1 to 1000 mg/L.

The present invention also provides a substrate processing method comprising: providing a substrate which has been prepared by forming interconnect recesses in an insulating film provided in a surface of the substrate, and depositing a barrier metal film and a copper film in this order on the surface; removing the copper film on the surface of the substrate so that copper substantially remains only within the interconnect recesses; and removing the copper film and the barrier metal film on the surface of the substrate with an etching liquid capable of adjusting the etching rate ratio between the copper film and the barrier metal film.

The removal of the copper film is preferably carried out by CMP, electrolytic processing or chemical etching, or a combination thereof.

The mixing ratio of the components of the etching liquid may be set arbitrarily, and the etching liquid having the predetermined composition may be supplied to the surface of the substrate to remove the copper film and the barrier metal film. Further, the etching liquid may be supplied to the surface of the substrate while controlling the mixing ratio of the components of the etching liquid.

BRIEF DESCRIPTION OF THE DRAWING

FIG. 1 is a schematic diagram illustrating a substrate processing apparatus for carrying out a substrate processing method according to the present invention.

DETAILED DESCRIPTION OF THE PREFERRED EMBODIMENTS

The substrate processing method of the present invention comprises etching a copper film and a barrier metal film, both exposed on a surface of a substrate, respectively at a desired etching rate by using an etching liquid capable of adjusting the etching rate ratio between the copper film and the barrier metal film.

FIG. 1 schematically shows a substrate processing apparatus for carrying out a substrate processing method according to the present invention. As shown in FIG. 1, the substrate processing apparatus comprises a substrate holder 10 for holding and rotating a substrate W with its front surface facing upwardly, and a chemical supply apparatus 14 for supplying an etching liquid 12 to approximately the center of the rotating substrate W held by the substrate holder 10. The chemical supply apparatus 14 includes a chemical supply nozzle 16 disposed above the substrate W held by the substrate holder 10, and a chemical supply line 20 extending from a chemical tank 18 for storing the etching liquid 12.

The chemical tank 18 is equipped with a chemical analysis unit 22 and a chemical component replenishment line 24. The chemical analysis unit 22 analyzes the composition, concentration, etc. of the etching liquid in the chemical supply apparatus 14, including a pH, oxidation-reduction potential, ion concentration, organic matter concentration and electrical conductivity. Based on the analytical results or according to arbitrarily set conditions, a chemical component(s) is supplied through the chemical replenishment line 24 into the chemical tank 18.

The components of the etching liquid 12 are thus set arbitrarily in the chemical tank 18, and the etching liquid 12 having the predetermined composition is supplied through the chemical supply line 20 and the chemical supply nozzle 16 to the surface of the substrate W held by the substrate holder 10. The components of the etching liquid 12 can be controlled variably during the supply of the etching liquid 12.

An etching liquid for use in the present invention contains at least an oxidizing agent, while the other components, etc. may vary depending upon the type of the barrier metal film to be etched.

For example, when the barrier metal film is tantalum, a tantalum compound such as tantalum nitride, titanium or a titanium compound such as titanium nitride, hydrofluoric acid is used as an acid for dissolving such a barrier metal film. In particular, tantalum nitride is hard to dissolve only with hydrofluoric acid, while it can be dissolved with a mixture of hydrofluoric acid and an oxidizing agent and the rate of dissolution depends on the concentration of hydrofluoric acid.

With respect to a copper film, on the other hand, its etching rate varies widely depending upon the mixing ratio between hydrofluoric acid and an oxidizing agent. In order to lower the etching rate of copper film while etching a barrier metal film of e.g. tantalum nitride, it is necessary to make the weight ratio of an oxidizing agent to hydrofluoric acid smaller. In order to make the ratio ($R_{BM}/R_{CU}$) of the etching rate ($R_{BM}$) Of barrier metal film to the etching rate ($R_{CU}$) of copper film within the range of 1 to 100, it is necessary to further lower the etching rate of copper film. To this end, a chloride ion source may be added to the etching liquid.

In an etching liquid for use in the case where the barrier metal film is tantalum, a tantalum compound, titanium or a titanium compound, the content of hydrofluoric acid may be from 1 to 10 wt %. If the content of hydrofluoric acid is less than 1 wt %, the etching rate of the barrier metal film is insufficient. If the content of hydrofluoric acid exceeds 20 wt %, the cost will be increased and a silicon-based insulating film can, undesirably, be etched excessively. An example of an oxidizing agent for use in the etching liquid is hydrogen peroxide. It is preferred that the weight ratio of oxidizing agent to hydrofluoric acid be not more than 0.1, especially not more than 0.05. Further, hydrochloric acid, a metal chloride, etc. may be added as a chloride ion source to the etching liquid. Such a compound as a chloride ion source is preferably added in an amount of 1 to 500 mg/L, especially 10 to 200 mg/L in terms of the amount of chloride ions. The lowering of the etching rate of copper film is insufficient when the amount of chloride ions is less than 1 mg/L. When the amount of chloride ions exceeds 500 mg/L, the etching rate of copper rather increases. In addition, there is a fear of metal contamination when a metal chloride is employed.

The etching liquid may further contain an anticorrosive agent to lower the etching rate of copper film. Examples of usable anticorrosive agents include a benzazole compound, imidazole, alkylimidazole, triazole, etc. Of these, abenzazole compound is preferred because of its good anticorrosive action. Examples of benzazole compounds include benzimidazole, mercaptobenzimidazole, benzotriazole (BTA), tolyltriazole, mercaptobenzothiazole and their derivatives. BTA and/or its derivative is particularly preferred. BTA is used generally in an amount of 0.0001 to 0.01 mol/L. In the system in which BTA and chloride ions are co-present, the etching rate of copper film tends to decrease as the concentration of BTA increases to a certain level. When the BTA concentration exceeds the certain level, the etching rate of copper film tends to increase. Though the certain level of BTA concentration, at which the etching rate of copper film becomes minimal, varies depending upon the concentration of chloride ions and the concentrations of acid and oxidizing agent, it is about 0.001 to 0.001 mol/L (about 0.01 to 0.1 wt %) under the conditions according to the present invention.

Further, the etching rate of barrier metal film increases by addition of copper ions to the etching liquid. A copper salt of an inorganic or organic acid may be used as a source of copper ions. The copper ion source may be used in an amount of 1 to 500 mg/L, preferably 10 to 100 mg/L in terms of the amount of copper. An amount of less than 1 mg/L, in terms of copper, is insufficient to raise the etching rate of barrier metal film. If the copper ion source is used in an amount exceeding 500 mg/L in terms of copper, the etching rate of barrier metal film does not increase substantially any more. When copper chloride is used as a copper ion source, it also serves as a chloride ion source.

In order to provide a flatter finish surface, it is preferred to add an organic acid to the etching liquid. Examples of the organic acid include acetic acid, citric acid, malic acid, oxalic acid, malonic acid, maleic acid, lactic acid, etc. The content of the organic acid is preferably not more than 2%, especially not more than 1%.

On the other hand, when the barrier metal film is tungsten or a tungsten compound, such as tungsten nitride, the barrier metal film can be dissolved only with an oxidizing agent, such as hydrogen peroxide, and the rate of dissolution depends on the concentration of the oxidizing agent. Though a copper film is corroded rapidly by the oxidizing agent alone, its etching rate decreases largely when a small amount of an organic acid is added to the etching liquid. Accordingly, in order to lower the etching rate of copper film while etching a barrier metal film of tungsten nitride, it is necessary to make the weight ratio of the organic acid to the oxidizing agent small. In order to make the ratio ($R_{BM}/R_{CU}$) of the etching rate ($R_{BM}$) of barrier metal film to the etching rate ($R_{CU}$) of copper film within the range of 0.5 to 100, it is necessary to further lower the etching rate of copper film. To this end, a chloride ion source may preferably be added to the etching liquid.

In an etching liquid for use in the case where the barrier metal film is tungsten or a tungsten compound, the content of an oxidizing agent, such as hydrogen peroxide, is about 1 to 30 wt %. If the content of oxidizing agent is less than 1 wt %, the etching rate of the barrier metal film is insufficient.

The content of an organic acid is preferably such as to make the pH of the etching liquid not less than 3, especially from 4 to 6. If the pH of the etching liquid is less than 3, the etching rate of copper film will be increased undesirably.

Examples of organic acids usable in the etching liquid may include acetic acid, citric acid, malic acid, oxalic acid, malonic acid, maleic acid, lactic acid, etc. Ammonium chloride, a metal chloride, etc. may be used as the chloride ion source. The chloride ion source is preferably used in an amount of 1 to 500 mg/L, especially 10 to 200 mg/L in terms of the amount of chloride ions.

The lowering of the etching rate of copper film is insufficient when the amount of chloride ions is less than 1 mg/L. When the amount of chloride ions exceeds 500 mg/L, the etching rate of copper film rather increases. In addition, there is a fear of metal contamination when a metal chloride is employed.

The etching liquid may further contain an anticorrosive agent to lower the etching rate of copper film. The same anticorrosive agent as described above in relation to the case where the barrier metal film is tantalum or tantalum nitride, may be used.

Further, the etching rate of barrier metal film increases by addition of copper ions to the etching liquid. A copper salt of an inorganic or organic acid may be used as a source of copper ions. The copper ion source may be used in an amount of 1 to 500 mg/L, preferably 10 to 100 mg/L in terms of the amount of copper. An amount of less than 1 mg/L, in terms of copper, is insufficient to raise the etching rate of barrier metal film. If the copper ion source is used in an amount exceeding 500 mg/L in terms of copper, the etching rate of barrier metal film does not increase substantially any more. When copper chloride is used as a copper ion source, it also serves as a chloride ion source.

A method for preparing an etching liquid for use in the present invention is not particularly limited. An etching liquid having the above-described composition may be prepared and used. Alternatively, since a very small amount of copper is dissolved in the etching liquid which has been used in etching, part or the whole of the used etching liquid may be recycled to raise the etching rate of barrier metal film.

The composition of an etching liquid may be constant during etching. Alternatively, depending upon the state of the copper film remaining after the previous process step, etc., it is possible to change the concentration of a particular component(s) of an etching liquid within the above-described range between the initial stage and the final stage of etching. In case of increasing the concentration of a particular component or adding a new component, either the whole etching liquid may be replaced or only the particular or new component may be added to the etching liquid.

Preferred embodiments of the present substrate processing method will now be described in greater detail.

An embodiment of the present method relates to flattening processing of a substrate that is carried out after removal of an unnecessary copper film from the substrate in which copper has been embedded in trenches, etc. by a damascene process.

In particular, the copper-plated substrate surface by a damascene process is first polished by CMP to remove an unnecessary copper film. In the CMP, a polishing liquid for copper film polishing is used, and only a copper film is removed. After the polishing, the polishing liquid is cleaned off the substrate. After the CMP processing, etching processing is carried out at a desired etching rate by using an etching liquid capable of adjusting the etching rate ratio between a copper film and a barrier metal film. The etching processing may be carried out by immersing a substrate in the etching liquid filling a tank, or by supplying the etching liquid to a rotating substrate.

Another embodiment of the present invention relates to flattening processing, which takes the place of CMP, of e.g. a substrate in which a low-k material having a very low mechanical strength is used. According to this embodiment, an unnecessary copper film is first removed by electrolytic polishing or chemical etching.

Electrolytic polishing may be carried out by using ultrapure water as an electrolytic solution in order to prevent contamination. According to this electrolytic polishing, a catalyst having an anion exchange group is interposed between the copper film, serving as an anode, and a cathode, and a voltage is applied between the copper film and the cathode in the presence of ultrapure water, whereby that portion of the copper film which faces the cathode is etched.

Chemical etching of the copper film may be carried out by using an etching liquid comprising an acid and an oxidizing agent as main components or an etching liquid comprising ammonia water and an oxidizing agent as main components. The etching processing may be carried out by immersing a substrate in the etching liquid filling a tank, or by supplying the etching liquid to a rotating substrate.

After the electrolytic polishing or chemical etching of copper, the substrate is subjected to etching processing using an etching liquid capable of adjusting the etching rate ratio between a copper film and a barrier metal film, whereby the remaining copper film and a barrier metal on the substrate are flattened. The etching processing may be carried out by immersing the substrate in the etching liquid filling a tank, or by supplying the etching liquid to the substrate while rotating the substrate. In case the previous etching of copper film is carried out by the method of supplying an etching liquid to a rotating substrate, the later etching of barrier metal film can be carried out successively by the same apparatus.

The following examples are provided to further illustrate the present invention and are not to be construed as limiting the invention in any manner.

EXAMPLE 1

On an 8-inch silicon wafer, an inter-level dielectric of $SiO_2$ and a stopper film of SiN were formed in this order. A low-dielectric constant film of a low-k material was formed on the stopper film and a cap layer was formed on the low-k material film. Trenches were formed in the low-k material film and the cap layer of the silicon wafer. Thereafter, a barrier metal film of tantalum nitride (TaN) and a copper seed film, which serves as an electric feeding layer upon plating, were deposited in this order on the entire surface by sputtering. A copper film was then formed on the entire surface by conventional plating to prepare a sample.

The silicon wafer sample was first subjected to CMP to remove an extra copper film. Thereafter, the sample was subjected to a scrub-cleaning step to remove particles, such as polishing grains and polishing debris, adhering to the surface of the sample.

Next, the sample was subjected to an etching step. In the etching step, the sample was set in a rotary-type substrate processing apparatus. While rotating the sample, an etching liquid having the composition shown in Table 1 (Ex. 1) was supplied to the front surface of the sample and pure water was supplied to the back surface to carry out etching of only the front surface where the barrier metal film lies. Subsequently to the etching processing, the front and back surfaces of the sample were rinsed with pure water, followed by spin-drying. As a result, the barrier metal film on the cap layer was removed without etching of copper in the trenches, thus forming copper damascene interconnects.

The etching rates of the etching liquid of Example 1 for a TaN surface and a copper surface are as shown in Table 1.

EXAMPLE 2

A silicon wafer sample was prepared in the same manner as in Example 1. The sample was first subjected to electrolytic processing of the copper film. The copper film of the substrate was connected to an anode, while an electrode, to which a non-woven fabric having a strong cation exchange group is attached, is connected to a cathode. The copper film surface was brought close to the non-woven fabric having a strong cation exchange group, and a voltage was applied between the copper film and the cathode in a flow of ultrapure water to etch the copper film.

Next, the sample was subjected to an etching step. In the etching step, while rotating the sample by a rotary-type substrate processing apparatus, an etching liquid having the composition shown in Table 1 (Ex. 2) was supplied to the front surface of the sample and pure water was supplied to the back surface to carry out etching of only the front surface where the barrier metal film lies. Subsequently to the etching processing, the front and back surfaces of the sample were rinsed with pure water, followed by spin-drying. As a result, the barrier metal film on the cap layer was removed without etching of copper in the trenches, thus forming copper damascene interconnects.

The etching rates of the etching liquid of Example 2 for a TaN surface and a copper surface are shown in Table 1.

EXAMPLE 3

On an 8-inch silicon wafer, an inter-level dielectric of $SiO_2$ and a stopper film of SiN were formed in this order. A low-dielectric constant film of a low-k material was formed on the stopper film by spin-coating and a cap layer was formed on the low-k material film. Trenches were formed in the low-k material film and the cap layer of the silicon wafer. Thereafter, a barrier metal film of titanium nitride (TiN) and a copper seed film, which serves as an electric feeding layer upon plating, were deposited in this order on the entire surface by sputtering. A copper film was then formed on the entire surface by conventional plating to prepare a sample.

The silicon wafer sample was first subjected to chemical etching to remove an extra copper film. In particular, the sample was set in a rotary-type substrate processing apparatus. While rotating the sample, an etching liquid for copper (containing hydrogen peroxide and sulfuric acid) was supplied to the front surface of the sample and pure water was supplied to the back surface, thereby etching away an extra copper film. After the etching, the front and back surfaces of the sample were rinsed with pure water.

Next, the sample was subjected to a step of etching the barrier metal film. In this etching step, while rotating the sample by the same rotary-type substrate processing apparatus, an etching liquid having the composition shown in Table 1 (Ex. 3) was supplied to the front surface of the sample and pure water was supplied to the back surface to carry out etching of only the front surface where the barrier metal film lies. Subsequently to the etching processing, the front and back surfaces of the sample were rinsed with pure water, followed by spin-drying. As a result, the barrier metal film on the cap layer was removed without etching of copper in the trenches, thus forming copper damascene interconnects.

The etching rates of the etching liquid of Example 3 for a TiN surface and a copper surface are also shown in Table 1.

COMPARATIVE EXAMPLE 1

A silicon wafer sample was prepared in the same manner as in Example 1. The sample was first subjected to CMP to remove an extra copper film. Thereafter, the sample was subjected to a scrub-cleaning step to remove particles, such as polishing grains and polishing debris, adhering to the surface of the sample.

Next, the sample was subjected to an etching step. In the etching step, the sample was set in a rotary-type substrate processing apparatus. While rotating the sample, an etching liquid having the composition shown in Table 1 (Comp. Ex. 1) was supplied to the front surface of the sample and pure water was supplied to the back surface to carry out etching of only the front surface where the barrier metal film lies. Subsequently to the etching processing, the front and back surfaces of the sample were rinsed with pure water, followed by spin-drying. As a result, copper in the trenches was also etched.

The etching rates of the etching liquid of Comparative Example 1 for a TaN surface and a copper surface are also shown in Table 1.

COMPARATIVE EXAMPLE 2

A silicon wafer sample was prepared in the same manner as in Example 1. The sample was first subjected to CMP to remove an extra copper film. Thereafter, the sample was subjected to a scrub-cleaning step to remove particles, such as polishing grains and polishing debris, adhering to the surface of the sample.

Next, the sample was subjected to an etching step. In the etching step, the sample was set in a rotary-type substrate processing apparatus. While rotating the sample, an etching liquid having the composition shown in Table 1 (Comp. Ex. 2) was supplied to the front surface of the sample and pure water was supplied to the back surface to carry out etching of only the front surface where the barrier metal film lies. Subsequently to the etching processing, the front and back surfaces of the sample were rinsed with pure water, followed by spin-drying. As a result, copper in the trenches was also etched.

The etching rates of the etching liquid of Comparative Example 2 for a TaN surface and a copper surface are also shown in Table 1.

COMPARATIVE EXAMPLE 3

The procedure of Comparative Example 2 was repeated except for using in the etching step an etching liquid having the composition shown in Table 1 (Comp. Ex. 3). As a result, copper in the trenches was also etched.

The etching rates of the etching liquid of Comparative Example 3 for a TaN surface and a copper surface are also shown in Table 1.

TABLE 1

|  | Ex. 1 | Ex. 2 | Ex. 3 | Comp. Ex. 1 | Comp. Ex. 2 | Comp. Ex. 3 |
|---|---|---|---|---|---|---|
| HF content (wt %) | 10 | 10 | 10 | 10 | 10 | 10 |
| $H_2O_2$ content (wt %) | 0.15 | 0.6 | 0.15 | 0.15 | 0.6 | 0.15 |
| Hydrochloric acid (mg/L) | — | 50 | 100 | — | 100 | 1000 |
| BTA content (wt %) | — | — | 0.04 | 0.04 | 0.2 | — |
| Copper chloride Cu content (mg/L) | 25 | — | — | — | — | — |
| Copper sulfate Cu content (mg/L) | — | 100 | — | — | — | — |
| Citric acid content (mg/L) | 0.02 | — | — | — | — | — |
| Copper etching rate (nm/min) | 1 | 17 | 1.4 | 10 | 840 | 48 |
| TaN etching rate (nm/min) | 13 | 29 | — | 3 | 26 | 8 |
| TiN etching rate (nm/min) | — | — | 4 | — | — | — |
| Etching rate ratio* | 13 | 1.7 | 2.8 | 0.3 | 0.03 | 0.17 |

*TaN/Cu etching rate ratio or TiN/Cu etching rate ratio

EXAMPLE 4

On an 8-inch silicon wafer, an inter-level dielectric of $SiO_2$ and a stopper film of SiN were formed in this order. A low-dielectric constant film of a low-k material was formed on the stopper film by CVD and a cap layer was formed on the low-k material film. Trenches were formed in the low-k material film and the cap layer of the silicon wafer. Thereafter, a barrier metal film of tungsten nitride (WN) and a copper seed film, which serves as an electric feeding layer upon plating, were deposited in this order on the entire surface by sputtering. A copper film was then formed on the entire surface by the conventional plating to prepare a sample.

The silicon wafer sample was first subjected to CMP to remove an extra copper film in such a manner that a slight copper film remained on the sample. Thereafter, the sample was subjected to a scrub-cleaning step to remove particles, such as polishing grains and polishing debris, adhering to the surface of the sample.

Next, the sample was subjected to an etching step. In the etching step, the sample was set in a rotary-type substrate processing apparatus. While rotating the sample, an etching liquid having the composition shown in Table 2 (Ex. 4①) was first supplied to the front surface of the sample and pure water was supplied to the back surface to etch the copper film and the barrier metal film. Subsequently, an etching liquid having the composition shown in Table 2 (Ex. 4②) was supplied to the front surface of the substrate and pure water was supplied to the back surface to carry out etching of only the front surface where the barrier metal film lies.

Subsequently to the etching processing, the front and back surfaces of the substrate were rinsed with pure water, followed by spin-drying. As a result, the barrier metal film on the cap layer was removed without etching of copper in the trenches, thus forming copper damascene interconnects.

The etching rates of the etching liquids of Example 4 for a WN surface and a copper surface are also shown in Table 2.

EXAMPLE 5

The procedure of Example 4 was repeated except for using, instead of the etching liquids used in Example 4 (Ex. 4① and Ex. 4②), etching liquids having the compositions shown in Table 2 (Ex. 5① and Ex. 5②).

As a result, the barrier metal film on the cap layer was removed without etching of copper in the trenches, thus copper damascene interconnects.

The etching rates of the etching liquids of Example 5 for a WN surface and a copper surface are also shown in Table 2.

TABLE 2

|  | Ex. 4 ① | Ex. 4 ② | Ex. 5 ① | Ex. 5 ② |
|---|---|---|---|---|
| $H_2O_2$ content (wt %) | 6 | 6 | 6 | 6 |
| Citric acid content (mg/L) | 5 | 5 | 400 | — |
| Copper Chloride Cu content (mg/L) | — | 10 | 10 | 10 |
| PH | 4.7 | 4.6 | 3.0 | 6.5 |
| Copper etching rate (nm/min) | 7 | <1 | 64 | 14 |
| WN etching rate (nm/min) | 12 | 24 | 16.5 | 22 |
| WN/Cu etching rate ratio | 1.7 | 24 | 0.26 | 1.6 |

The present invention provides a substrate processing method which can adjust the etching rate ratio between a copper film and a barrier metal film, and which enables etching of a barrier metal film at room temperature without application of a mechanical load and without excessive etching of a necessary portion of copper.

Thus, it is possible to etch a barrier metal even at a higher etching rate than that for a copper film. It therefore becomes possible, by using an etching liquid having an appropriate composite, to flatten a copper film and a barrier metal film on a semiconductor substrate without employing CMP, etc. widely used currently.

Accordingly, the present invention can be utilized advantageously in introducing inter-level dielectrics of low-dielectric constant low-k or ultra low-k materials whose uses in next-generation semiconductor substrates are being studied.

What is claimed is:

1. A substrate processing method comprising:
   providing a substrate prepared by forming interconnect recesses in an insulating film provided in a surface of the substrate and depositing a barrier metal film and a copper film in this order on the surface;
   removing the copper film on the surface of the substrate so that copper substantially remains only within the interconnect recesses; and
   removing and flattening the copper film and the barrier metal film on the surface of the substrate by performing chemical etching with an etching liquid which etches the barrier metal film at a higher etching rate than the copper film and without applying a mechanical load to the copper film and the barrier metal film during said removing and flattening;
   wherein the barrier metal film is composed of tantalum nitride and/or tantalum, or titanium nitride and/or titanium, and the etching liquid contains hydrofluoric acid, an oxidizing agent and a chloride, the etching liquid having a mixing ratio between the hydrofluoric acid and the oxidizing agent such that the barrier metal film is etched at a higher etching rate than the cooper film in said removing and flattening.

2. The substrate processing method according to claim 1, wherein the chloride is copper chloride and its content is 1 to 1000 mg/L.

3. The substrate processing method according to claim 1, wherein the oxidizing agent is hydrogen peroxide and its content is not more than 1/10 of the weight of the hydrofluoric acid.

4. A substrate processing method comprising:
   providing a substrate prepared by forming interconnect recesses in an insulating film provided in a surface of the substrate and depositing a barrier metal film and a copper film in this order on the surface;
   removing the copper film on the surface of the substrate so that copper substantially remains only within the interconnect recesses; and
   removing and flattening the copper film and the barrier metal film on the surface of the substrate by performing chemical etching with an etching liquid which etches the barrier metal film at a higher etching rate than that for the copper film and without applying a mechanical load to the copper film and the barrier metal film during said removing and flattening;
   wherein the barrier metal film is composed of tantalum nitride and/or tantalum, or titanium nitride and/or titanium, and the etching liquid contains hydrofluoric acid, an oxidizing agent, a chloride and an organic acid, the etching liquid having a mixing ratio between the hydrofluoric acid and the oxidizing agent such that the barrier metal film is etched at a higher etching rate than the copper film in said removing and flattening.

5. The substrate processing method according to claim 4, wherein the chloride is copper chloride and its content is 1 to 1000 mg/L.

6. The substrate processing method according to claim 4, wherein the oxidizing agent is hydrogen peroxide and its content is not more than 1/10 of the weight of the hydrofluoric acid.

7. A substrate processing method comprising:
   providing a substrate prepared by forming interconnect recesses in an insulating film provided in a surface of the substrate and depositing a barrier metal film and a copper film in this order on the surface;
   removing the copper film on the surface of the substrate so that copper substantially remains only within the interconnect recesses; and
   removing and flattening the copper film and the barrier metal film on the surface of the substrate by performing chemical etching with an etching liquid which etches the barrier metal film at a higher etching rate than that for the copper film and without applying a mechanical load to the copper film and the barrier metal film during said removing and flattening;

wherein the barrier metal film is composed of tantalum nitride and/or tantalum, or titanium nitride and/or titanium, and the etching liquid contains hydrofluoric acid, an oxidizing agent, a hydrochloric acid, and a copper compound and/or an anticorrosive agent for copper, the etching liquid having a mixing ratio between the hydrofluoric acid and the oxidizing agent such that the barrier metal film is etched at a higher etching rate than the copper film in said removing and flattening.

8. The substrate processing method according to claim 7, wherein the copper compound is copper sulfate.

9. The substrate processing method according to claim 7, wherein the oxidizing agent is hydrogen peroxide and its content is not more than $\frac{1}{10}$ of the weight of the hydrofluoric acid.

10. A substrate processing method comprising:

providing a substrate prepared by forming interconnect recesses in an insulating film provided in a surface of the substrate and depositing a barrier metal film and a copper film in this order on the surface;

removing the copper film on the surface of the substrate so that copper substantially remains only within the interconnect recesses; and removing and flattening the copper film and the barrier metal film on the surface of the substrate by performing chemical etching with an etching liquid which etches the barrier metal film at a higher etching rate than that for the copper film and without applying a mechanical load to the copper film and the barrier metal film during said removing and flattening;

wherein the barrier metal film is composed of tungsten nitride and/or tungsten, and the etching liquid contains an oxidizing agent and has a pH of not less than 3.

11. The substrate processing method according to claim 10, wherein the oxidizing agent is hydrogen peroxide and its content is 1 to 20% by mass.

12. The substrate processing method according to claim 10, wherein the pH of the etching liquid is adjusted by adding an organic acid thereto.

13. A substrate processing method comprising:

providing a substrate prepared by forming interconnect recesses in an insulating film provided in a surface of the substrate and depositing a barrier metal film and a copper film in this order on the surface;

removing the copper film on the surface of the substrate so that copper substantially remains only within the interconnect recesses; and removing and flattening the copper film and the barrier metal film on the surface of the substrate by performing chemical etching with an etching liquid which etches the barrier metal film at a higher etching rate than that for the copper film and without applying a mechanical load to the copper film and the barrier metal film during said removing and flattening;

wherein the barrier metal film is composed of tungsten nitride and/or tungsten, and the etching liquid contains an oxidizing agent and a copper compound and has a pH of not less than 3.

14. The substrate processing method according to claim 13, wherein the oxidizing agent is hydrogen peroxide and its content is 1 to 20% by weight.

15. The substrate processing method according to claim 13, wherein the pH of the etching liquid is adjusted by adding an organic acid thereto.

16. The substrate processing method according to claim 13, wherein the copper compound is copper chloride and its content is 1 to 1000 mg/L.

* * * * *